US012061229B2

(12) United States Patent
Huang et al.

(10) Patent No.: US 12,061,229 B2
(45) Date of Patent: Aug. 13, 2024

(54) IN-LINE ELECTRICAL DETECTION OF DEFECTS AT WAFER LEVEL

(71) Applicant: Taiwan Semiconductor Manufacturing Company, Hsinchu (TW)

(72) Inventors: Yu-Hsuan Huang, Taichung (TW); Chien-Liang Chen, Hsinchu (TW); Pei-Hsuan Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 56 days.

(21) Appl. No.: 17/851,261

(22) Filed: Jun. 28, 2022

(65) Prior Publication Data
US 2023/0417830 A1 Dec. 28, 2023

(51) Int. Cl.
*G01R 31/307* (2006.01)
*H01L 21/66* (2006.01)

(52) U.S. Cl.
CPC ............ *G01R 31/307* (2013.01); *H01L 22/34* (2013.01)

(58) Field of Classification Search
CPC ....... G01R 31/307; H01L 22/34; H01L 22/12; G01N 23/2251; G06T 7/00
See application file for complete search history.

(56) References Cited

U.S. PATENT DOCUMENTS

| 7,635,843 | B1* | 12/2009 | Luo | H01L 22/12 |
| | | | | 250/307 |
| 2007/0197020 | A1* | 8/2007 | Ramappa | H01L 22/24 |
| | | | | 438/622 |
| 2008/0237586 | A1* | 10/2008 | Sun | H01L 22/32 |
| | | | | 438/18 |
| 2008/0265251 | A1* | 10/2008 | Xiao | H01L 22/12 |
| | | | | 250/307 |
| 2011/0013826 | A1* | 1/2011 | Xiao | G01R 31/307 |
| | | | | 257/E27.06 |
| 2017/0154687 | A1* | 6/2017 | Song | H01L 22/12 |

FOREIGN PATENT DOCUMENTS

TW    I754151 B    2/2022

OTHER PUBLICATIONS

Hong Xiao, Integrated Circuit Processing Technologies, Introduction to Semiconductor Technology 2nd edition, Semiconductors-Design and Construction, 2012, p. 287-594, V 2, SPIE, USA.

* cited by examiner

*Primary Examiner* — Akm Zakaria
(74) *Attorney, Agent, or Firm* — Lippes Mathias LLP

(57) ABSTRACT

In a semiconductor manufacturing method includes providing a plurality of patterns on a semiconductor substrate. The patterns include an NMOS structure arranged next to an N+/N well structure, and/or a PMOS structure arranged next to a P+/P well structure. The method further includes: receiving a plurality of images by applying an electron beam to the patterns; and transferring the semiconductor substrate to a next process step if there is no image conversion according to a predetermined image contrast property of the patterns.

20 Claims, 12 Drawing Sheets

IN-LINE ELECTRICAL DETECTION OF DEFECTS AT WAFER LEVEL

BACKGROUND

The following relates to the semiconductor integrated circuit (IC) device fabrication arts, IC device characterization arts, IC device quality control arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
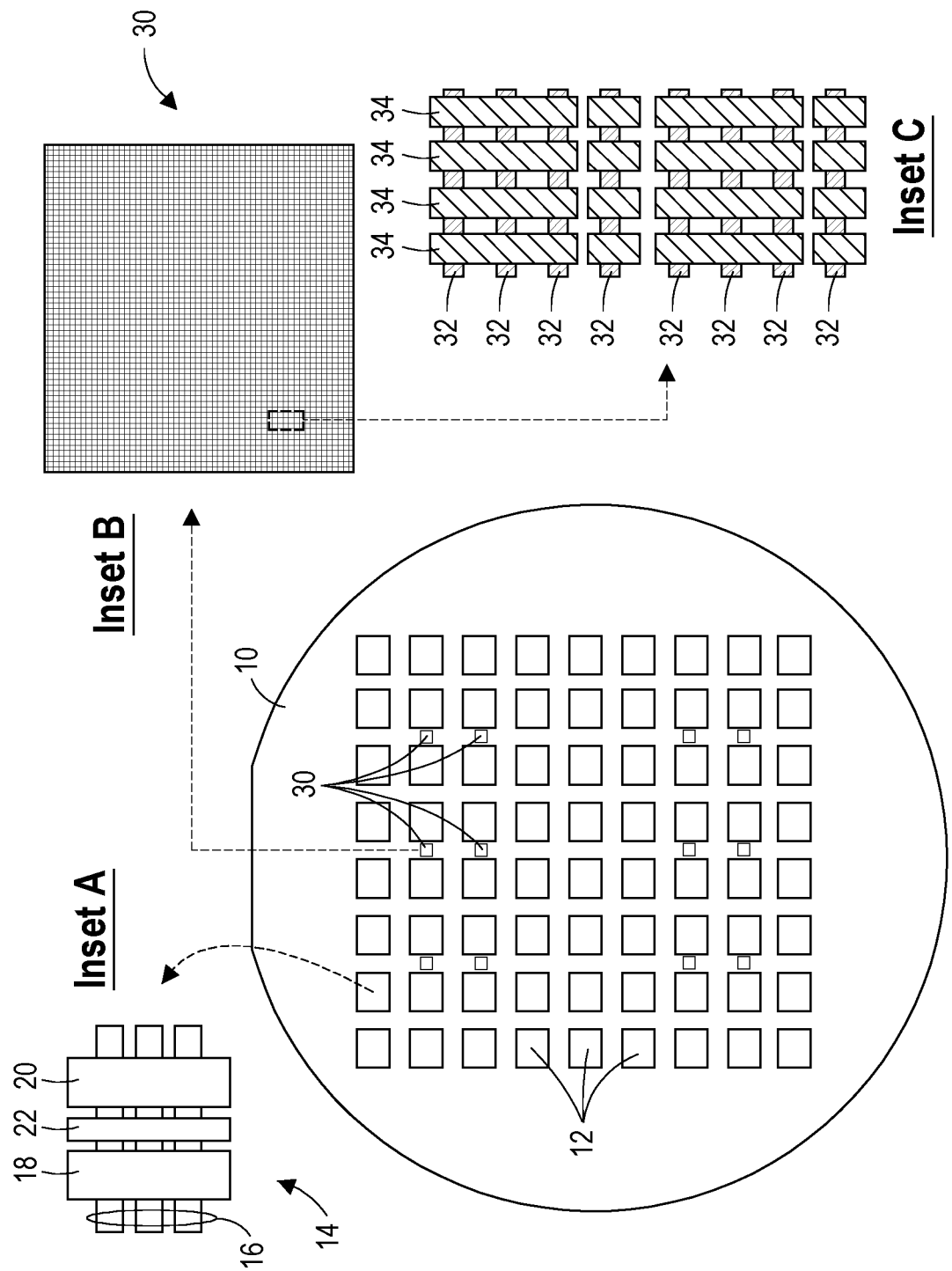
FIG. 1 diagrammatically illustrates a top view of a semiconductor wafer with an array of integrated circuit (IC) dies disposed thereon and further including voltage contrast electron beam inspection (VC-EBI) test patterns at spaces between the dies. Inset A diagrammatically illustrates a representative metal-oxide-semiconductor (MOS) transistor. Inset B illustrates a VC-EBI test patterns area, and Inset C illustrates a portion of the VC-EBI test patterns area of Inset B.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various approaches exist for wafer-level testing of IC devices, that is, prior to dicing the wafer to separate individual IC dies. Wafer acceptance test (WAT) approaches electrically probe circuitry. However, WAT is performed after back-end-of-line (BEOL) processing is (at least mostly) complete, and is tedious and time consuming. Electron beam microscopy of the wafer using a scanning electron microscope (SEM) can be performed after the front end-of-line (FEOL) processing and before BEOL processing, thus providing detection of defects earlier in the fabrication process. Additionally, analysis of the acquired SEM images to detect defects can be automated using various techniques such as matched filtering, comparison against a reference image (e.g., computing a difference image between the acquired SEM image and the reference image such that defects in the former show up as distinct regions of difference), or a machine learning (ML) tool such as a trained artificial neural network (ANN). However, SEM imaging provides structural information but not electrical information, and furthermore it may be challenging to detect small defects in the SEM image. Conversely, SEM imaging may detect structural defects that are not electrical defects.

Charge induced voltage contrast (VC) electron beam inspection (EBI) is another technique which is also performed using an SEM. In VC-EBI, secondary electron (SE) yield is measured so as to provide voltage contrast. This enables direct observation of certain electrical defects. VC-EBI can be performed after middle end-of-line (MEOL) processing in which the source/drain contacts have been formed (also sometimes referred to in the art as MD metallization), thus also providing early detection of defects. As with structural SEM imaging, analysis of VC-EBI images to detect defects can advantageously be automated using matched filtering, comparison with a reference image, trained ANN or other trained ML tool, or so forth.

However, while VC-EBI can detect shorting between N-type and P-type features, other types of electrical defects are typically not detectable by this technique. In particular, undesired merging between neighboring source or drain regions of the same doping type is usually not detectable. Yet such "same doping type" shorting is often a common defect modality due to prevalence of neighboring "same doping type" regions in many integrated circuit (IC) designs.

The following discloses improvements to VC-EBI that enables detection of a wide range of electrical defects. For example, the disclosed approaches enable detection of shorting between two neighboring N-type source/drain regions to inspect semiconductor wafers, or shorting between two neighboring P-type source/drain regions. The following further discloses corresponding patterns for use in VC-EBI.

With reference to FIG. 1, a top view is shown of a semiconductor wafer 10, which includes an array of integrated circuit (IC) dies 12. The semiconductor wafer 10 may, by way of nonlimiting illustrative example, comprise a silicon wafer doped N-type or P-type depending on the design, a silicon-on-insulator (SOI) wafer, or so forth. Each IC die 12 may include P-type metal-oxide-semiconductor (PMOS) devices, N-type metal-oxide-semiconductor (NMOS) devices, resistors, capacitors, and so forth (details not shown). Inset A illustrates a typical MOS device 14 (which could be a PMOS or an NMOS). As seen in Inset A, the MOS device 14 includes an electrically conductive channel or other active structure 16, a source structure 18 and a drain structure 20 separately in contact with the active structure 16, and a gate structure or line 22 interposed between the source and drain structures 18, 20. In some embodiments, the MOS device 14 may be a finFET in which the electrically conductive channel or active structure 16 includes a three-dimensional (3D) fin, or a set of mutually parallel fins (e.g., three mutually parallel fins as shown in Inset A), disposed on a surface of the wafer. (In some embodiments, the fins 16 may be formed by removal of some material of the wafer so as to expose the fin as a 3D structure). In some such embodiments, the FinFET device 14 may be a gate-all-around (GAA) FinFET device. While Inset A diagrammatically shows a single representative MOS device 14, it is to be understood that each IC die 12 may include dozens, hundreds, thousands, or more MOS devices that in the final IC design will be electrically interconnected by metallization traces formed during BEOL processing to form the complete IC. Depending on the IC design, these MOS devices may be PMOS devices, NMOS devices, or some mixture of PMOS and NMOS devices. Each IC die 12 typically includes other features such as n-well regions and/or p-well regions to provide electrical isolation for individual or groups of MOS devices, and so forth that are not shown. The IC dies 12 formed on and/or in the wafer 10 of FIG. 1 are assumed to be at the stage of fabrication when the FEOL processing is complete and the MEOL processing has formed electrical contacts to the source/drain regions 18, 20, as well as possibly also to the gate 22.

As further seen in FIG. 1, the wafer includes areas 30 of voltage contrast electron beam inspection (VC-EBI) patterns disposed in spaces between the IC dies 12. The spaces between the IC dies 12 where the areas 30 of VC-EBI patterns are disposed are sometimes referred to as scribe lines, as during a later step the wafer 10 will be cut or scribed along the spaces between the dies 12 to separate the IC dies 12. Inset B diagrammatically illustrates one representative area 30 of VC-EBI patterns (also referred to herein as test patterns) in isolation, and Inset C illustrates a portion of the area 30 of VC-EBI test patterns area of Inset B. As best seen in Inset C, the VC-EBI test patterns comprise fins (or more generally electrically conductive MOS channel or active structure) 32 on which are disposed source/drain structures 34 separately in contact with the active structure 32. "Source/drain structures" may refer to a source or a drain, individually or collectively dependent upon the context. In a typical approach, the active structures 32 of the VC-EBI test patterns are formed at the same time and using the same fabrication steps (e.g., same etching, deposition, and/or other semiconductor processing steps) as the active structures 16 of the MOS devices of the IC dies 12, and likewise the source/drain structures 34 of the VC-EBI test patterns are formed at the same time and using the same fabrication steps as the source and drain structures 18, 20 of the MOS devices of the IC dies 12. Although not shown in Inset C, the VC-EBI test patterns may optionally also include other features analogous to the MOS devices, such as gate structures or lines that are formed at the same time and using the same fabrication steps as the gate structures or lines 22 of the MOS devices 14 of the IC dies 12, and/or source/drain contacts that are electrically connected to the source/drain structures 34 of the VC-EBI test patterns, which again are formed at the same time and using the same fabrication steps as the contacts (i.e. MD metallization) of the source and drain structures 18, 20 of the MOS devices 14 of the IC dies 12. In addition to being formed at the same time and using the same fabrication steps, the features of the VC-EBI test patterns of the areas 30 may have the same critical dimension (CD) as the MOS devices 14 of the IC dies 12. For example, the spacing between neighboring source/drain structures 34 in the VC-EBI test patterns may be the same as the spacing between neighboring source/drain structures 18, 20 of neighboring MOS devices in the IC dies 12.

The source/drain structures 34 of the test patterns in the areas 30 correspond to the source 18 or drain 20 of the MOS device 14 of the active IC dies 12, and as just discussed are formed at the same time and using the same fabrication steps. However, the distinction between source and drain depends on the operational circuitry within which the MOS device is placed. Hence, because the test patterns of the areas 30 of test patterns are not operational MOS devices in circuitry of the active IC dies 12, the generalized term source/drain structures 34 is used in the context of the test patterns of the areas 30.

Because the areas 30 of VC-EBI test patterns are formed at the same time and using the same fabrication steps as the MOS devices of the active IC dies 12, the semiconductor fabrication process advantageously typically does not need to be modified to include the VC-EBI test patterns, except that the photolithography mask or masks used in the fabrication steps are suitably modified to includes openings for defining the additional VC-EBI test patterns.

While as discussed above the VC-EBI test patterns in the areas 30 have substantial similarities to the MOS devices 14 of the active IC dies 12, the VC-EBI test patterns are designed as disclosed herein to facilitate detection of various types of electrical defects by VC-EBI.

Figure 2:
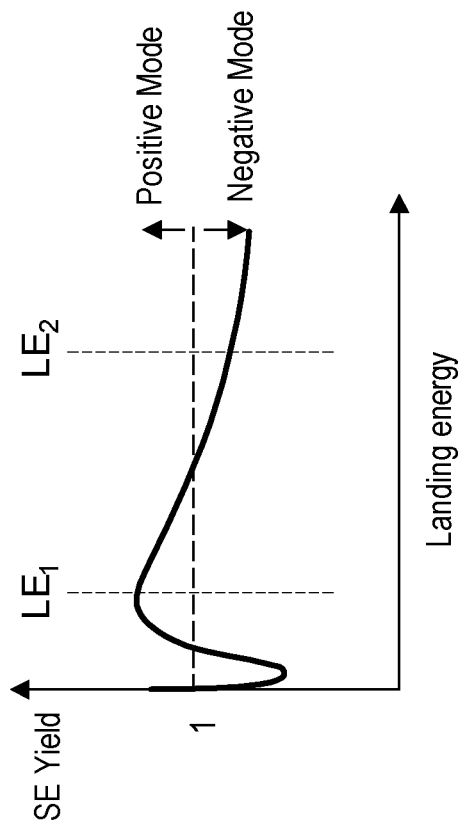
FIG. 2 diagrammatically illustrates secondary electron (SE) yield versus landing energy during EBI.

With reference now to FIG. 2, some principles of VC-EBI are described. FIG. 2 illustrates a plot of the secondary electron (SE) yield detected by a secondary electron detector of a scanning electron microscope (SEM) as a function of the landing energy of the electrons of the electron beam applied to the wafer by the SEM. The landing energy is the accelerating voltage of the electrons applied by the SEM minus the stage bias of the stage holding the wafer. As seen in FIG. 2, at certain values of the landing energy, such as $LE_1$ indicated in FIG. 2, the SE yield is greater than 1, meaning that on average each electron of the electron beam results in more than one secondary electron being emitted from the wafer surface. Operation with the SE yield greater than 1 is referred to as positive mode VC-EBI. Conversely, at other values of the landing energy, such as $LE_2$ indicated in FIG. 2, the SE yield is less than 1, meaning that on average each electron of the electron beam results in less than one secondary electron being emitted from the wafer surface. Operation with the SE yield less than 1 is referred to as negative mode VC-EBI.

Figure 3:
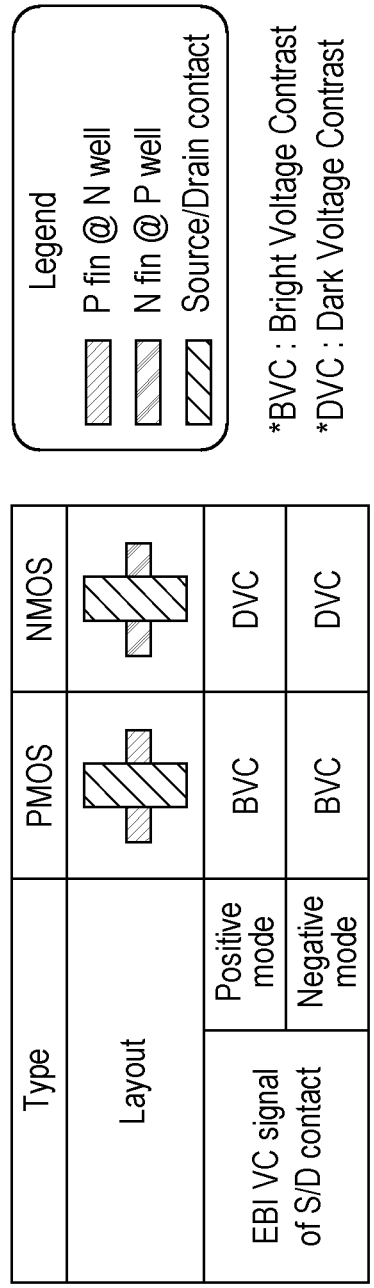
FIG. 3 diagrammatically illustrates a classification of voltage contrast (VC) signals obtained for P-type metal-oxide-semiconductor (PMOS) and N-type metal-oxide-semiconductor (NMOS) devices in positive VC mode and negative VC mode.
Figure 4B:
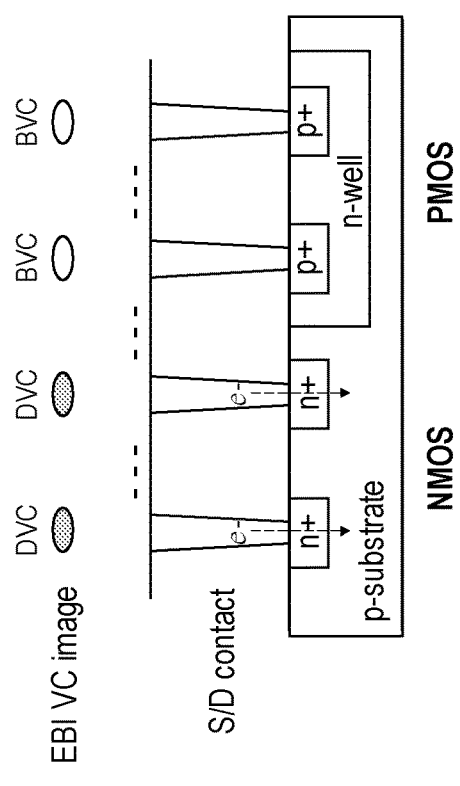
FIGS. 4(a) and 4(b) diagrammatically show side sectional views of NMOS and PMOS source/drain structures, illustrating the bright or dark voltage contrast obtained for: positive VC mode (FIG. 5(a)), and negative VC mode (FIG. 5(b)), in the absence of any shorting.
Figure 4A:
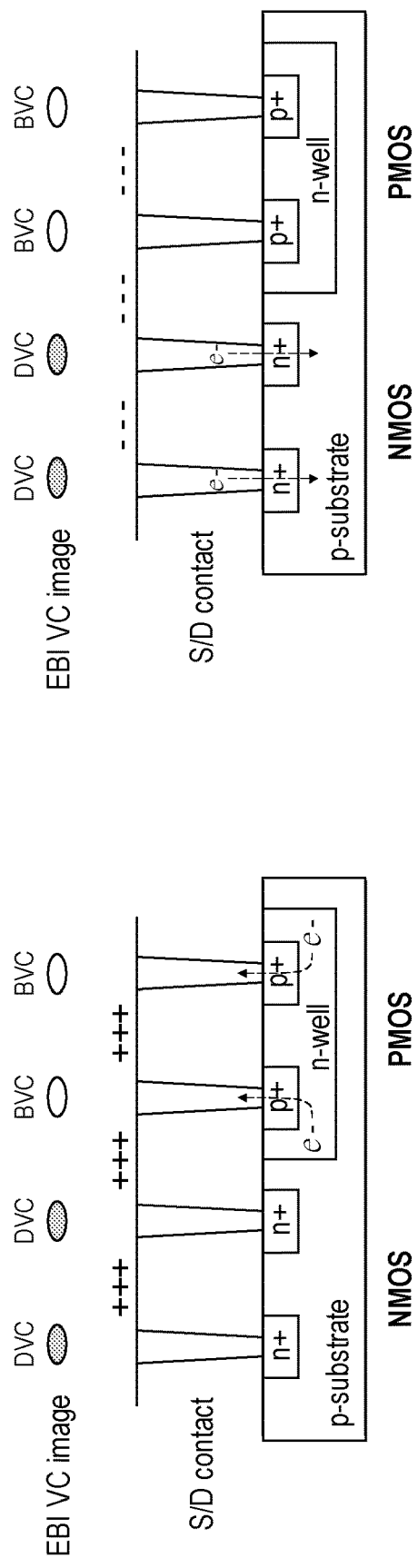

With reference to FIG. 3 and with further reference to FIG. 4, the VC-EBI response for a PMOS device and an NMOS device in positive mode and negative mode are summarized. Both devices are assumed to have complete FEOL processing and MEOL processing up to and including fabrication of the source and drain contacts electrically connected to the source and drain structures. FIG. 4 diagrammatically shows a side sectional view of NMOS and PMOS source/drain structures, illustrating the bright or dark voltage contrast obtained for (a) positive VC mode, and (b) negative VC mode, in the absence of any shorting. As summarized in FIG. 3 and shown in FIGS. 4(a) and 4(b), a PMOS device (i.e., p⁺-type material on or in an n-type well) exhibits bright voltage contrast (i.e. high electron yield corresponding to a bright region in the VC-EBI image) in both positive mode and negative mode, while an NMOS device (i.e., n⁺-type material on or in a p-type well) exhibits dark voltage contrast (i.e. low electron yield corresponding to a dark region in the VC-EBI image) in both positive mode and negative mode.

Figures 5A, 5B, 5C:
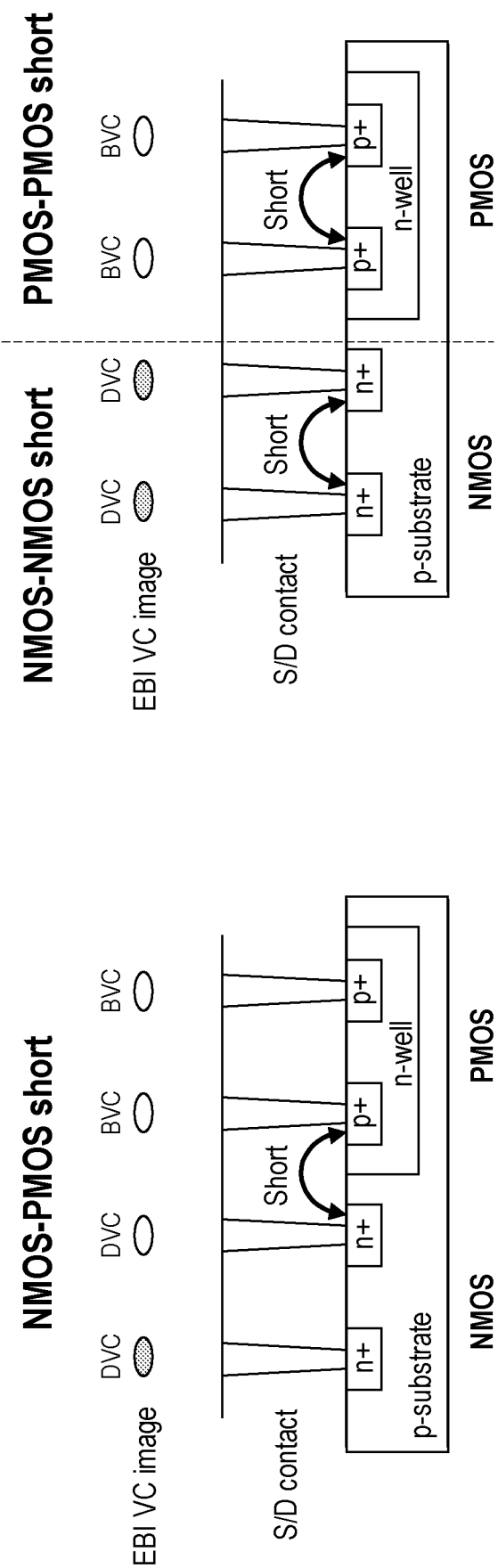
FIGS. 5(a), 5(b), and 5(c) diagrammatically show side sectional views of the voltage contrast in the case of: a short between adjacent NMOS and PMOS source/drain structures (FIG. 5(a)); a short between adjacent NMOS source/drain structures (FIG. 5(b)); and a short between adjacent PMOS source/drain structures (FIG. 5(c)).

However, as seen in FIG. 5(a), in the presence of an electrical short between adjacent PMOS and NMOS, the NMOS device exhibits bright contrast in both positive mode and negative mode, due to the impact of the PMOS device shorted to the NMOS device. Because of this, in the case where a PMOS device and an NMOS device are adjacent and there is shorting between the P-type source and/or drain structure and the N-type source and/or drain structure, this will appear in the VC-EBI image as the NMOS device exhibiting bright voltage contrast in either positive mode VC-EBI or negative mode VC-EBI. Thus, shorting between adjacent PMOS and NMOS devices is detectable by VC-EBI.

However, with reference to FIGS. 5(b) and 5(c), more common situations are shorting between the N-type source and/or drain structures of two adjacent NMOS devices (FIG. 5(b)), or the shorting between the P-type source and/or drain structures of two adjacent PMOS devices (FIG. 5(c)). These shorting situations are not detected by VC-EBI, because they do not result in electric charge transfer producing a change in the voltage contrast of the subject MOS devices. This is because both devices are PMOS devices, or both devices are NMOS devices, and so the shorting between the source and/or drain structures does not provide an electrical leakage pathway to change the induced charge and hence the voltage contrast.

With brief reference back to FIG. 1, in embodiments disclosed herein the areas 30 of test patterns include specially designed test patterns that are capable of detecting shorting between adjacent source or drain structures by VC-EBI. Because the test patterns of the areas 30 of test patterns (see FIG. 1) are not operational MOS devices of the active IC dies 12, the generalized term source/drain structures 34 is used when describing the source or drain structures of the test patterns.

Figure 6:
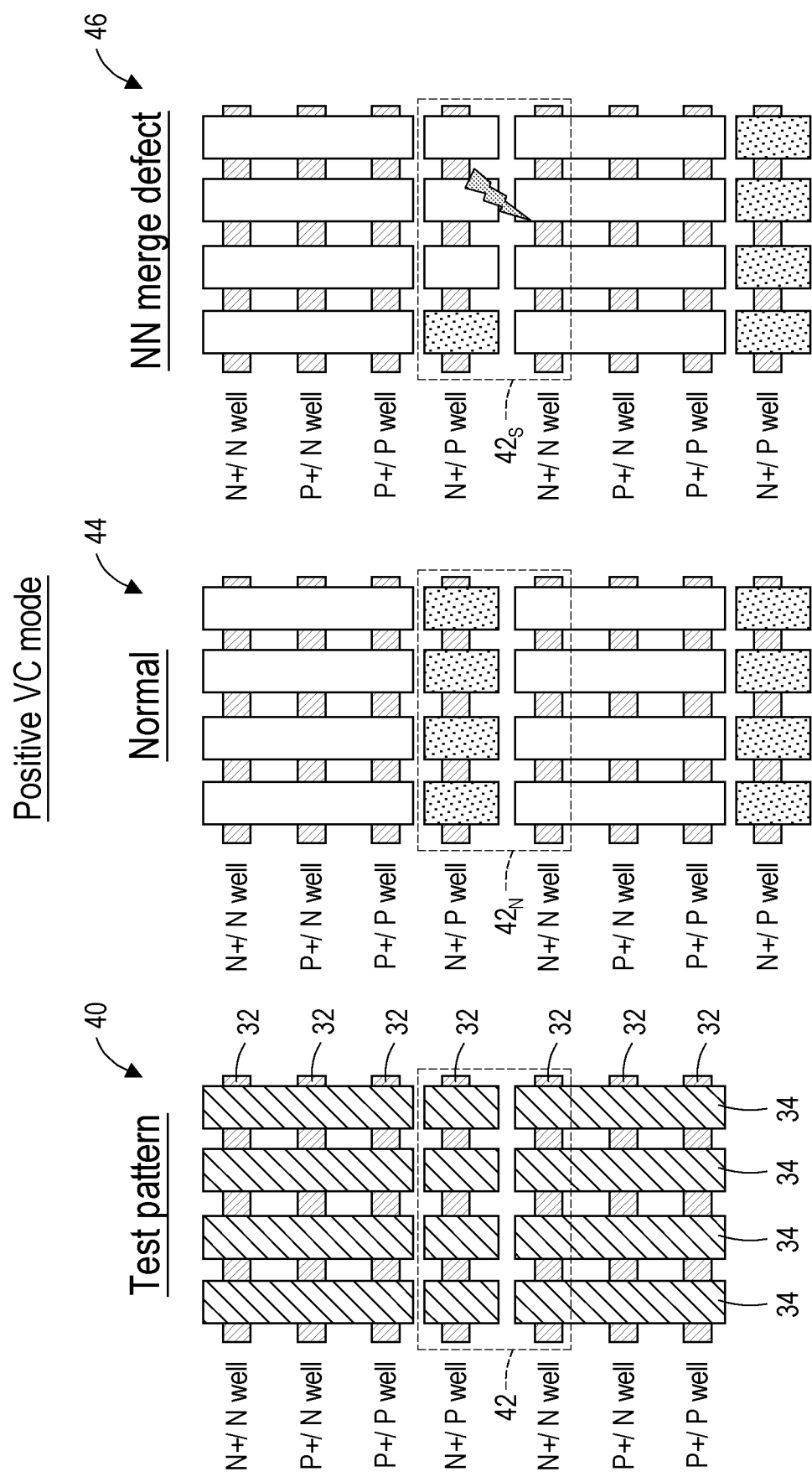
FIG. 6 diagrammatically illustrates an embodiment of VC-EBI test patterns effective for detecting shorting between neighboring N-type source/drain structures using positive VC mode.

With reference to FIG. 6, in a first embodiment an example is presented of test patterns 40 for detecting shorting between two N-type source or drain structures of MOS devices of the IC dies 12 of FIG. 1. Shorting between adjacent source/drain structures refers to an electrically conductive path being present between the adjacent source/drain structures. This typically is due to a physical merger of the adjacent source/drain structures, although it could also be due to another shorting mechanism such as presence of electrically conductive debris, contamination, or the like that creates the electrically conductive path between the adjacent source/drain structures. It will be appreciated that either merger of the adjacent source/drain regions or another shorting mechanism such as presence of electrically conductive debris, contamination, or the like is increasingly likely as the critical dimension (CD) for the spacing between the adjacent source/drain structures decreases.

FIG. 6 depicts the test patterns 40 labeled as to the doping types. In particular, the notation "N+/N well" indicates a structure in which the well of the active structure (e.g. illustrative fin 32) is N-type and the source/drain structures 34 separately in contact with the active structure 32 are also N-type (and more specifically N-type at a higher doping level than the N-well, as indicated by the notation "N+"). In similar fashion, "P+/N well" (corresponding to a PMOS device or structure) indicates a structure in which the well of the active structure is N-type and the source/drain structures 34 separately in contact with the active structure 32 are P-type. The notation "N+/P well" (corresponding to an NMOS device or structure) indicates a structure in which the well of the active structure is P-type and the source/drain structures 34 separately in contact with the active structure 32 are N-type. Finally, the notation "P+/P well" indicates a structure in which the well of the active structure is P-type and the source/drain structures 34 separately in contact with the active structure 32 are also P-type.

Although not shown in FIG. 6, it is to be understood that at in addition to the least one active structure 32 and the source/drain structures 34 separately in contact with the active structure(s), the structures of the test patterns further include source/drain contacts that are electrically connected to the source/drain structures. These source/drain contacts are typically formed of tungsten or another suitable metal, and this initial metallization stage is sometimes referred to as MD metallization of the MEOL processing of the IC dies 12 of FIG. 1.

With continuing reference to FIG. 6, of particular interest for detection of shorting between two N-type source or drain structures of MOS devices of the IC dies 12 of FIG. 1 is the combination 42 of two adjacent test patterns one of which is an N+/P well structure (i.e., an NMOS device or structure) and the other of which is an N+/N well structure. This combination 42 thus includes two adjacent N-type source/drain structures $34_{NP}$ and $34_{NN}$.

FIG. 6 also diagrammatically illustrates a positive-mode VC-EBI image 44 expected in the case of no shorting (i.e., "Normal"). As seen, the positive-mode VC-EBI image portion 42N corresponding to the combination 42 of two adjacent test patterns of interest for the normal VC-EBI image 44 exhibits dark voltage contrast (DVC) for the N+/P well structure, and exhibits bright voltage contrast (BVC) for the N+/N well. The DVC for the N+/P well structure is what is expected for an NMOS device imaged under positive-mode VC-EBI, as previously described with reference to FIG. 3, and as the N+/P well structure is the structure of an NMOS device. The BVC for the N+/N well structure in the positive-mode VC-EBI image 44 is due to the majority electron carriers of the heavily N-type source/drain structure of the N+/N well structure which provides a high secondary electron yield (and consequent bright voltage contrast) for the N+/N well structure.

FIG. 6 also diagrammatically illustrates a positive mode VC EBI image 46 expected in the case of shorting between (e.g., by merger of) the two N-type source/drain structures $34_{NP}$ and $34_{NN}$ of the combination 42. As seen, the positive mode VC EBI image portion 42S corresponding to the combination 42 of two adjacent test patterns of interest for the shorting case exhibits a change from DVC for the N+/P well structure in the normal image 44 to BVC in the image 46, while the N+/N well structure continues to exhibit BVC in the positive mode VC EBI image 46. The change from DVC to BVC for the N+/P well structure is due to transfer of electrons from the N-type source/drain structures $34_{NN}$ of the N+/N well structure to the N-type source/drain structures $34_{NP}$ of the N+/P well structure via the merger or other electrically conductive path (i.e. shorting, as indicated by a shorting symbol $S_{NN}$) between these two adjacent N-type source/drain structures $34_{NP}$ and $34_{NN}$. This transfer of electrons due to the shorting $S_{NN}$ increases the secondary electron yield of the N-type source/drain structures $34_{NP}$ of the N+/P well structure, resulting in the shift from DVC to BVC in the positive mode VC EBI image. Thus, the test patterns 40, and particularly the combination 42 of N+/P well and N+/N well test patterns, enables detection of shorting $S_{NN}$ between adjacent N-type source/drain structures $34_{NP}$ and $34_{NN}$ in positive mode VC EBI.

With continuing reference to FIG. 6 and further reference back to FIG. 1, the detected shorting $S_{NN}$ of adjacent N type source/drain structures $34_{NP}$ and $34_{NN}$ as described with reference to FIG. 6 occurs within areas 30 of test patterns, which are different areas than the areas of the IC dies 12. However, because the test patterns and the MOS devices of the IC dies 12 are formed at the same time and using the same fabrication steps (e.g., same etching, deposition, and/or other semiconductor processing steps), it can be reasonably expected that if shorting $S_{NN}$ of adjacent N-type source/drain structures $34_{NP}$ and $34_{NN}$ is detected in the test patterns then shorting of adjacent N-type source and/or drain structures of adjacent MOS devices is likely to also be present in the actual IC dies 12. Hence, the change from positive-mode VC EBI image portion 42N in the case of no short to positive-mode VC EBI image portion 42S in the case of a short constitutes an image conversion according to a predetermined image contrast property of the patterns.

Figure 7:
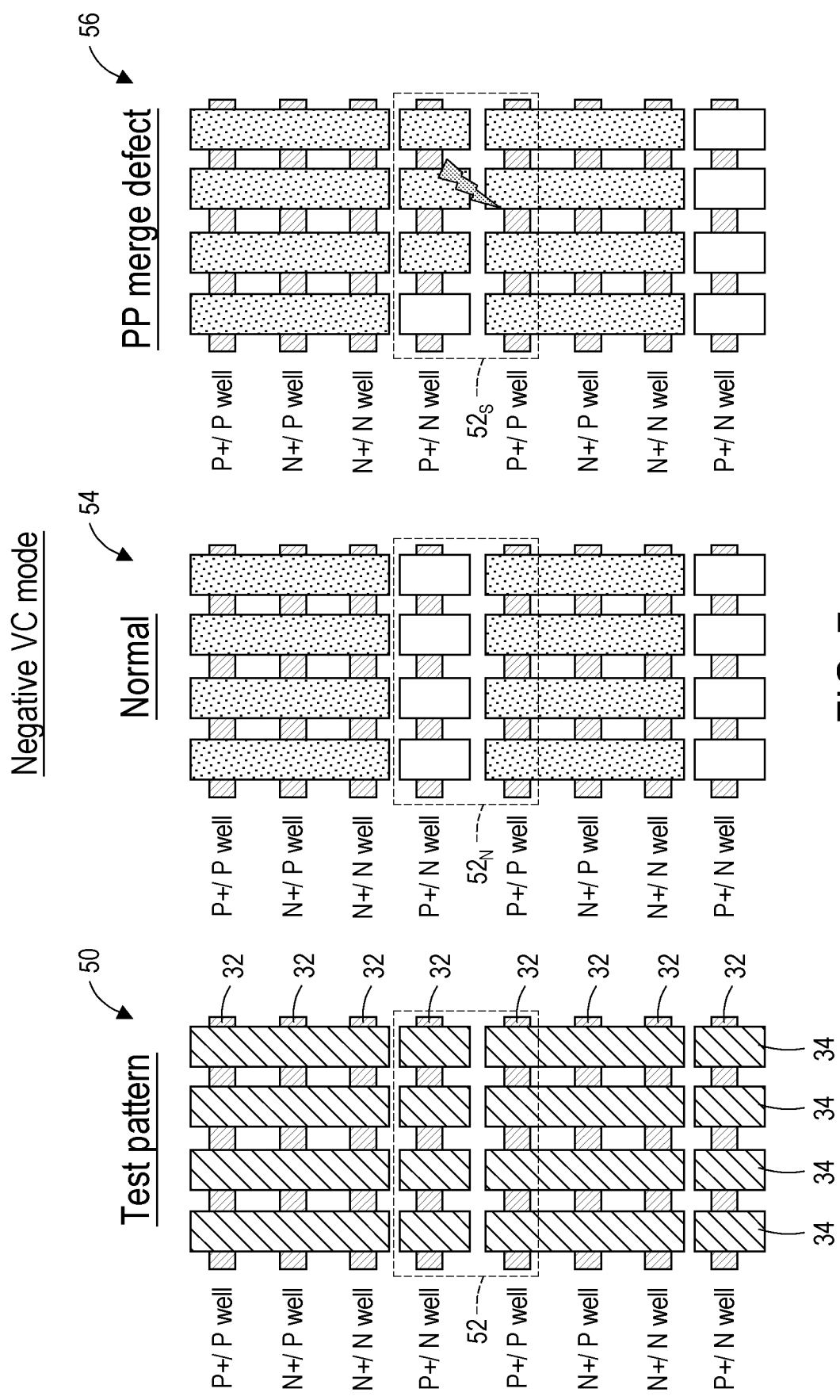
FIG. 7 diagrammatically illustrates an embodiment of VC-EBI test patterns effective for detecting shorting between neighboring P-type source/drain structures using negative VC mode.

With reference now to FIG. 7, in a second embodiment an example is presented of test patterns 50 for detecting shorting between two P-type source or drain structures of MOS devices of the IC dies 12 of FIG. 1. Again, such shorting between adjacent P-type source/drain structures is typically due to a physical merger of the adjacent P-type source/drain structures, although it could also be due to another shorting mechanism such as electrically conductive debris, contamination, or the like. FIG. 7 depicts the test patterns 50 labeled as to the doping types, including N+/N well structures, P+/P well structures, N+/P well structures, and P+/N well structures as already described with reference to FIG. 6. Also, although not shown in FIG. 7, it is to be understood that the structures of the test patterns further include source/drain contacts that are electrically connected to the source/drain structures, e.g. formed as the MD metallization of the MEOL processing of the IC dies 12 of FIG. 1.

With continuing reference to FIG. 7, of particular interest for detection of shorting between two P-type source or drain structures of MOS devices of the IC dies 12 of FIG. 1 is the combination 52 of two adjacent test patterns one of which is a P+/N well structure (i.e., an PMOS device or structure) and the other of which is a P+/P well structure. This combination 52 thus includes two adjacent P-type source/drain structures $34_{PN}$ and $34_{PP}$.

FIG. 7 also diagrammatically illustrates a negative-mode VC-EBI image 54 expected in the case of no shorting. As seen, the negative-mode VC-EBI image portion 52N corresponding to the combination 52 of two adjacent test patterns of interest for the normal VC-EBI image 54 exhibits bright voltage contrast (BVC) for the P+/N well structure, and exhibits dark voltage contrast (DVC) for the P+/P well. The BVC for the P+/N well structure is what is expected for a PMOS device in negative-mode VC-EBI based on the discussion of FIG. 3, since the P+/N well structure is the structure of a PMOS device. The DVC for the P+/P well structure in negative-mode VC-EBI is due to the majority hole carriers of the heavily P-type source/drain structure of the P+/P well structure which provides a low secondary electron yield (and consequent dark voltage contrast) for the P+/P well structure in negative-mode VC-EBI.

FIG. 7 also diagrammatically illustrates a negative-mode VC EBI image 56 expected in the case of shorting between (e.g., by merger of) the two P-type source/drain structures $34_{PN}$ and $34_{PP}$ of the combination 52. As seen, the negative-mode VC EBI image portion 52S corresponding to the combination 52 of two adjacent test patterns of interest for the shorting case exhibits a change from BVC for the P+/N well structure in the normal image 54 to DVC in the image 56, while the P+/P well structure continues to exhibit DVC. The change from BVC to DVC for the P+/N well structure is due to transfer of electrons from the P-type source/drain structures $34_{PN}$ of the P+/N well structure to the P-type source/drain structures $34_{PP}$ of the P+/P well structure via the merger or other electrically conductive path (i.e. shorting, as indicated by a shorting symbol $S_{PP}$) between these two adjacent P-type source/drain structures $34_{PN}$ and $34_{PP}$. This transfer of electrons due to the shorting $S_{PP}$ decreases the secondary electron yield of the P-type source/drain structures $34_{PN}$ of the P+/N well structure, resulting in the shift from BVC to DVC. Thus, the test patterns 50, and particularly the combination 52 of P+/N well and P+/P well test patterns, enables detection of shorting $S_{PP}$ between adjacent P-type source/drain structures $34_{PN}$ and $34_{PP}$ when using negative-mode VC EBI imaging.

With continuing reference to FIG. 7 and further reference back to FIG. 1, the detected shorting $S_{PP}$ of adjacent P type source/drain structures $34_{PN}$ and $34_{PP}$ as described with reference to FIG. 7 occurs within areas 30 of test patterns, which are different areas than the areas of the IC dies 12. However, because the test patterns and the MOS devices of the IC dies 12 are formed at the same time and using the same fabrication steps (e.g., same etching, deposition, and/or other semiconductor processing steps), it can be reasonably expected that if shorting $S_{PP}$ of adjacent P-type source/drain structures $34_{PN}$ and $34_{PP}$ is detected in the test patterns then shorting of adjacent P-type source and/or drain structures of adjacent MOS devices is likely to also be present in the actual IC dies 12. Hence, the change from negative-mode VC EBI image portion 52N in the case of no short to negative-mode VC EBI image portion 52S in the case of a short constitutes an image conversion according to a predetermined image contrast property of the patterns.

Figure 8:
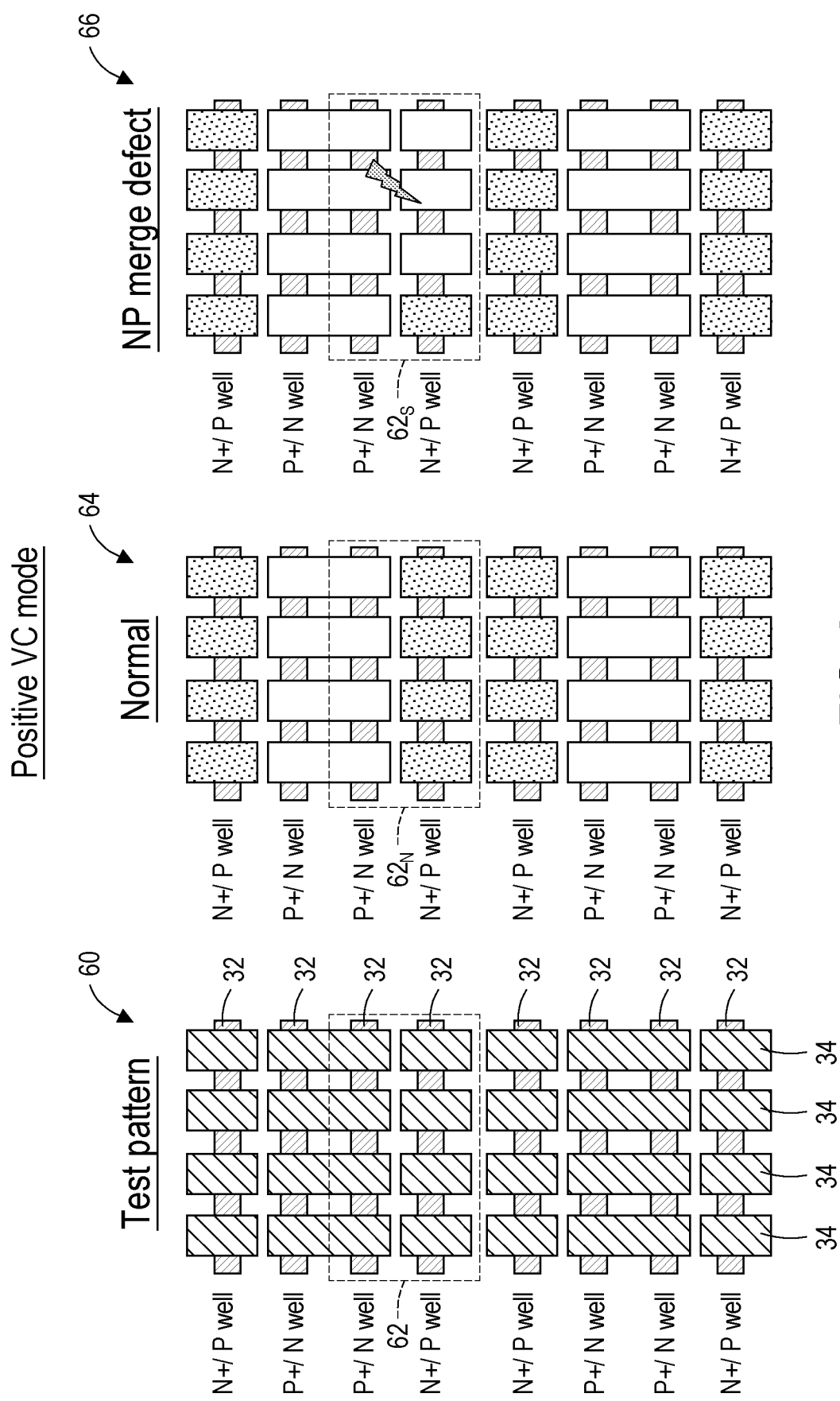
FIG. 8 diagrammatically illustrates an embodiment of VC-EBI test patterns effective for detecting shorting between neighboring N-type and P-type source/drain structures using positive VC mode.

With reference now to FIG. 8, in a third embodiment an example is presented of test patterns 60 for detecting shorting between a P-type source or drain structure and an N-type source or drain structure of respective MOS devices of the IC dies 12 of FIG. 1. FIG. 8 depicts the test patterns 60 labeled as to the doping types, including N+/N well structures, P+/P well structures, N+/P well structures, and P+/N well structures as already described with reference to FIG. 6. Also, although not shown in FIG. 8, it is to be understood that the structures of the test patterns further include source/drain contacts that are electrically connected to the source/drain structures, e.g. formed as the MD metallization of the MEOL processing of the IC dies 12 of FIG. 1.

With continuing reference to FIG. 8, of particular interest for detection of shorting between adjacent P-type and N type source or drain structures of MOS devices of the IC dies 12 of FIG. 1 is the combination 62 of two adjacent test patterns one of which is a P+/N well structure (i.e., a PMOS device or structure) and the other of which is a N+/P well structure (i.e., an NMOS device or structure). This combination 62 thus includes adjacent P-type and N-type source/drain structures $34_{PN}$ and $34_{NP}$.

FIG. 8 also diagrammatically illustrates a positive-mode VC-EBI image 64 expected in the case of no shorting. As seen, the positive-mode VC-EBI image portion 62N corresponding to the combination 62 of adjacent P+/N and N+/P test patterns for the normal VC-EBI image 64 exhibits bright voltage contrast (BVC) for the P+/N well structure, and exhibits dark voltage contrast (DVC) for the N+/P well. The BVC for the P+/N well structure is what is expected for a PMOS device in positive-mode VC-EBI based on the discussion of FIG. 3, since the P+/N well structure is the structure of a PMOS device. The DVC for the N+/P well structure in positive-mode VC-EBI is what is expected for an NMOS device in positive-mode VC-EBI based on the discussion of FIG. 3, since the N+/P well structure is the structure of an NMOS device.

FIG. 8 also diagrammatically illustrates a positive-mode VC EBI image 66 expected in the case of shorting $S_{PN}$ between (e.g., by merger of) the P-type and N type source/drain structures $34_{PN}$ and $34_{NP}$ of the combination 62. As seen, the positive-mode VC EBI image portion 62S corresponding to the combination 62 of two adjacent test patterns of interest for the shorting case exhibits a change from DVC for the N+/P well structure in the normal image 64 to BVC in the image 66, while the P+/N well structure continues to exhibit BVC. Thus, the test patterns 60, and particularly the combination 62 of P+/N well and N+/P well test patterns, enables detection of shorting between adjacent P-type and N type source/drain structures $34_{PN}$ and $34_{NP}$ when using positive-mode VC EBI imaging. Hence, the change from positive-mode VC EBI image portion 62N in the case of no short to positive-mode VC EBI image portion 62S in the case of a short $S_{PN}$ constitutes an image conversion according to a predetermined image contrast property of the patterns.

Figure 9:
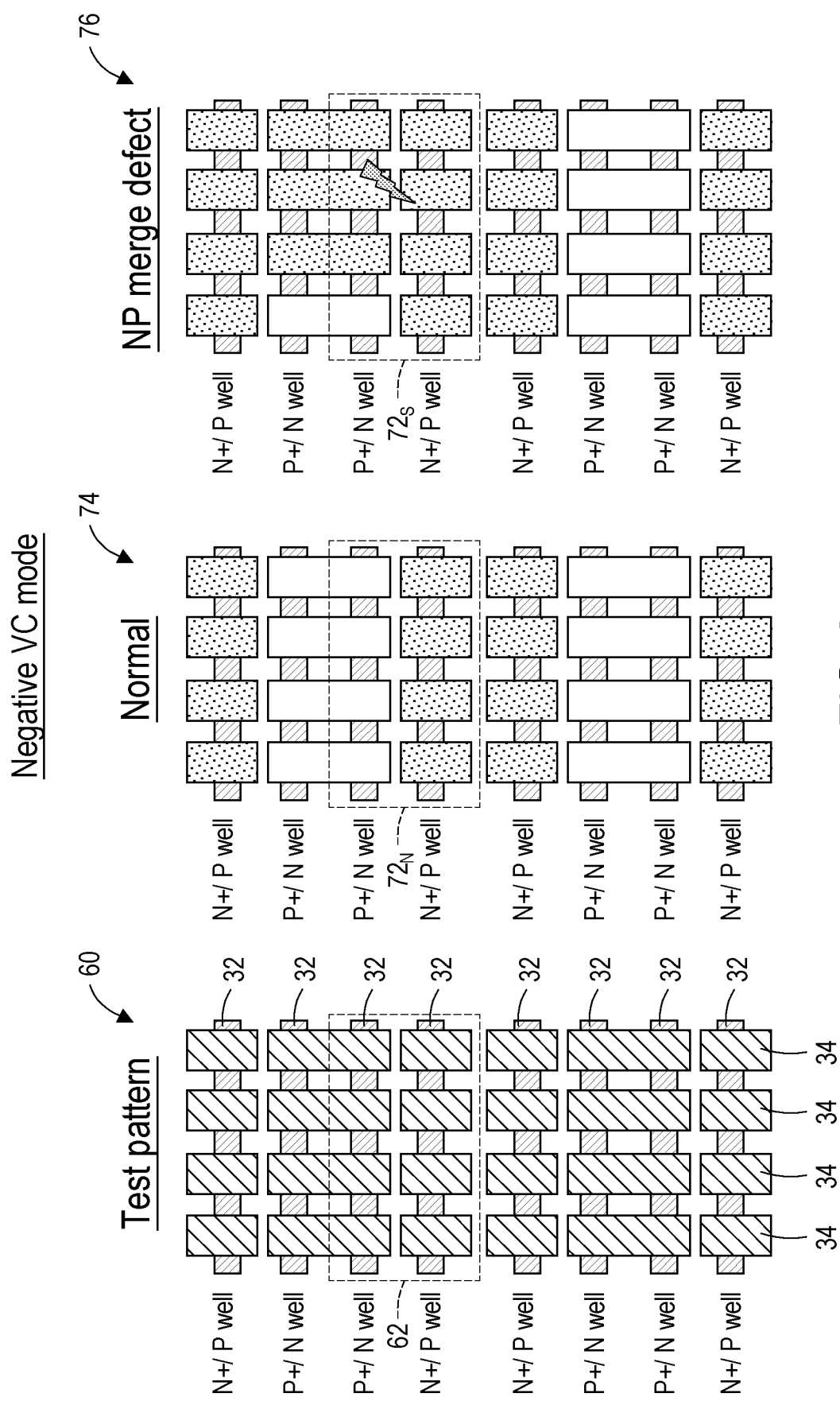
FIG. 9 diagrammatically illustrates an embodiment of VC-EBI test patterns effective for detecting shorting between neighboring N-type and P-type source/drain structures using negative VC mode.

With reference now to FIG. 9, in a variant of the third embodiment, the test patterns 60 can also be used for detecting shorting between a P-type source or drain structure and an N-type source or drain structure of respective MOS devices of the IC dies 12 of FIG. 1 using negative mode VC EBI. FIG. 9 depicts the same test patterns 60 as in FIG. 8, and again particular interest is placed on the combination 62 of two adjacent test patterns one of which is a P+/N well structure and the other of which is a N+/P well structure. This combination 62 thus includes adjacent P-type and N-type source/drain structures $34_{PN}$ and $34_{NP}$.

FIG. 9 also diagrammatically illustrates a negative-mode VC-EBI image 74 expected in the case of no shorting. As seen, the negative-mode VC-EBI image portion $72_N$ corresponding to the combination 62 of adjacent P+/N and N+/P test patterns for the normal VC-EBI image 74 exhibits bright voltage contrast (BVC) for the P+/N well structure, and exhibits dark voltage contrast (DVC) for the N+/P well. The BVC for the P+/N well structure is what is expected for a PMOS device in negative-mode VC-EBI based on the discussion of FIG. 3, since the P+/N well structure is the structure of a PMOS device. The DVC for the N+/P well structure in negative-mode VC-EBI is what is expected for an NMOS device in positive-mode VC-EBI based on the discussion of FIG. 3, since the N+/P well structure is the structure of an NMOS device.

FIG. 9 also diagrammatically illustrates a negative-mode VC EBI image 76 expected in the case of shorting $S_{PN}$ between (e.g., by merger of) the P-type and N type source/drain structures $34_{PN}$ and $34_{NP}$ of the combination 62. As seen, the negative-mode VC EBI image portion 72S corresponding to the combination 62 of two adjacent test patterns of interest for the shorting case exhibits a change from BVC for the P+/N well structure in the normal image 74 to DVC in the image 76, while the N+/P well structure continues to exhibit DVC. Thus, the test patterns 60, and particularly the combination 62 of P+/N well and N+/P well test patterns, also enables detection of shorting $S_{PN}$ between adjacent P-type and N type source/drain structures $34_{PN}$ and $34_{NP}$ when using negative-mode VC EBI imaging. Hence, the change from negative-mode VC EBI image portion $72_N$ in the case of no short to negative-mode VC EBI image portion 72S in the case of a short $S_{PN}$ constitutes an image conversion according to a predetermined image contrast property of the patterns.

Again, the detected shorting $S_{PN}$ of adjacent P type and N-type source/drain structures $34_{PN}$ and $34_{NP}$ using positive mode and negative mode VC EBI as described with reference to respective FIGS. 8 and 9 occurs within areas 30 of test patterns, which are different areas than the areas of the IC dies 12. However, because the test patterns and the MOS devices of the IC dies 12 are formed at the same time and using the same fabrication steps (e.g., same etching, deposition, and/or other semiconductor processing steps), it can be reasonably expected that if shorting $S_{PN}$ of adjacent P-type source/drain structures $34_{PN}$ and $34_{NP}$ is detected in the test patterns then shorting of adjacent P-type source and/or drain structures of adjacent MOS devices is likely to also be present in the actual IC dies 12.

Figure 10:
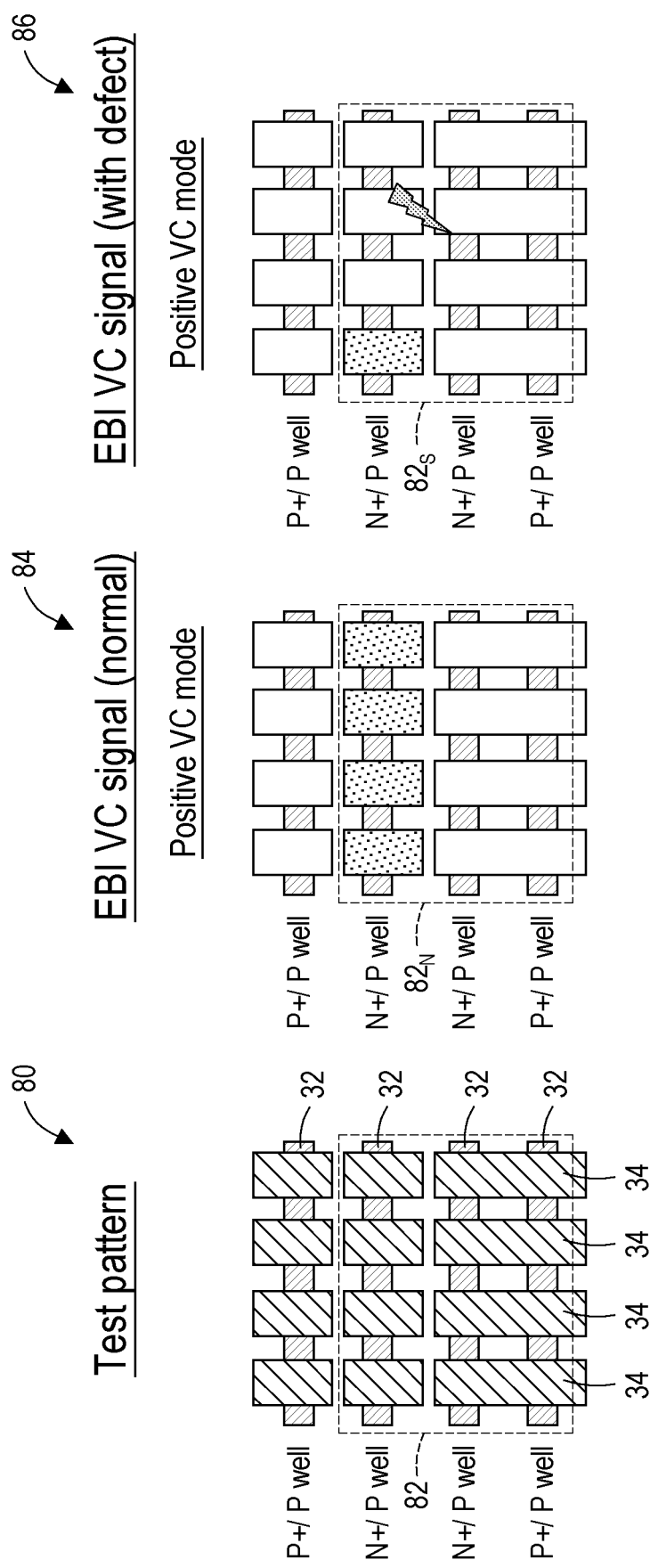
FIG. 10 diagrammatically illustrates an embodiment of VC-EBI test patterns effective for detecting shorting between metal contacts of neighboring source/drain structures using positive VC mode.

With reference now to FIG. 10, in a fourth embodiment it is described how the test patterns can be designed to detect other types of shorting defects, such as MD cut failure or MD-epitaxy shorting. In these types of defects, the shorting occurs at the source/drain contacts that are electrically connected to the source/drain structures 34, that is, during the MD metallization of the MEOL processing of the IC dies 12 of FIG. 1. FIG. 10 illustrates test patterns 80 for detecting such shorting at the MD metallization stage. FIG. 10 depicts the test patterns 60 labeled as to the doping types, including N+/N well structures, P+/P well structures, and N+/P well structures as already described with reference to FIG. 6. Also, although not shown in FIG. 10, it is to be understood that the structures of the test patterns further include source/drain contacts that are electrically connected to the source/drain structures, e.g. formed as the MD metallization of the MEOL processing of the IC dies 12 of FIG. 1.

Of particular interest for detection of shorting at the MD metallization stage is the combination 82 of three adjacent test patterns: two N+/P well structures, and a P+/P well structure. As further seen in FIG. 10, the P-type source/drain structures 34 of the N+/P well structure located in the middle of the combination 82 is shorted to the P-type source/drain structures 34 of the P+/P well structure.

FIG. 10 also diagrammatically illustrates a positive-mode VC-EBI image 84 expected in the case of no shorting between the two adjacent N+/P well structures. As seen, the positive-mode VC-EBI image portion $82_N$ corresponding to the combination 82, the top N+/P well structure exhibits dark voltage contrast (DVC), as expected since it has an NMOS device structure (see FIG. 3). However, due to the shorting between the middle N+/P well structure and the P+/P well structure, the middle N+/P well structure exhibits bright voltage contrast (BVC).

FIG. 10 also diagrammatically illustrates a positive-mode VC-EBI image 86 expected in the case of shorting between at the MD metallization of the two adjacent N+/P well structures. The shorting leads to the upper N+/P well structure also being shorted to the P+/P well structure, so that the upper N+/P well structure now also exhibits BVC in the same way as the middle N+/P well structure. Thus, the test patterns 80, and particularly the combination 82, enables detection of shorting at the MD level between adjacent N-type source/drain structures when using positive-mode VC-EBI imaging. Hence, the change from positive-mode VC-EBI image portion $82_N$ in the case of no short to positive-mode VC-EBI image portion $82_S$ in the case of a short constitutes an image conversion according to a predetermined image contrast property of the patterns.

Although not shown, it will be appreciated that a similar approach to that described with reference to FIG. 10 could be used to detect shorting at the MD level between adjacent P-type source/drain structures, by leveraging negative-mode VC-EBI imaging and deliberately shorting a middle P+/N well structure to an N+/N well structure.

With reference back to FIG. 1 along with FIGS. 6-10, the embodiments of FIGS. 6-10 depict test patterns that include the fins or other active structure 32 and the source/drain structures 34 separately in contact with the active structure 32, along with source/drain contacts electrically connected to the source/drain structures 34. The various test patterns 40, 50, 60, 80 of FIGS. 6-10 can be variously combined in the areas 30 of test patterns shown in FIG. 1. The choice of combination of test patterns may be governed, for example, by the types of mergers or shorting that may be expected for the design of the IC dies 12. For example, if there are no instances of N-type source or drain regions adjacent to other N-type source or drain regions, then N/N merger is not an issue and the type of test patterns 40 described with reference to FIG. 6 can be omitted. Likewise, if the shorting defects of interest can all be detected by positive mode VC-EBI then it may be sufficient to perform only positive-mode VC-EBI (or vice versa).

In some embodiments, the areas 30 of test patterns are distributed across the wafer 10 along scribe lines between IC dies 12. This advantageously enables wafer-level VC-EBI testing including detecting defects such as N/N mergers and P/P mergers that are generally not otherwise detectable by VC-EBI. In another embodiment, the areas 30 of test patterns are distributed across a dedicated test wafer that does not include any IC dies. The areas 30 of test patterns can generally be sized as desired. In one nonlimiting illustrative example, each area 30 is 30 microns by 30 microns square. In some embodiments, the MD pitch is the minimum pitch at the technology node, and this pitch is suitably limited by the resolution of the scanning electron microscope (SEM) used for the VC-EBI. It is also noted that while the term P-type well and N-type well and similar nomenclature is used herein, in some situations the well may be the wafer 10 as a whole, e.g. if the wafer 10 is doped P-type then a P-well may be the P-wafer itself and N-wells are then formed by ion implantation, dopant diffusion or another suitable doping technique.

As previously discussed with reference to FIG. 2, the VC-EBI imaging is performed for a specific landing energy that is effective to produce the desired positive mode or negative mode voltage contrast. The landing energy is the accelerating voltage of the electrons applied by the SEM minus the stage bias of the stage holding the wafer. In some embodiments, the wafer backside may be grounded during the VC-EBI imaging. In this case the stage bias is zero volts, and the landing energy equals the accelerating voltage of the electrons applied by the SEM.

Moreover, the test patterns can beneficially include other features of the MOS devices of the IC dies 12 of FIG. 1, such as gate lines. Including such structures is straightforward as they again can be formed at the same time and using the same fabrication steps as the structures of the MOS devices of the IC dies 12, and doing so can ensure that the test patterns full mimic the MOS devices of the IC dies 12 thereby ensuring that detection of shorting defects in the test patterns is an accurate surrogate for shorting defects in the actual MOS devices of the IC dies 12.

Figure 11:
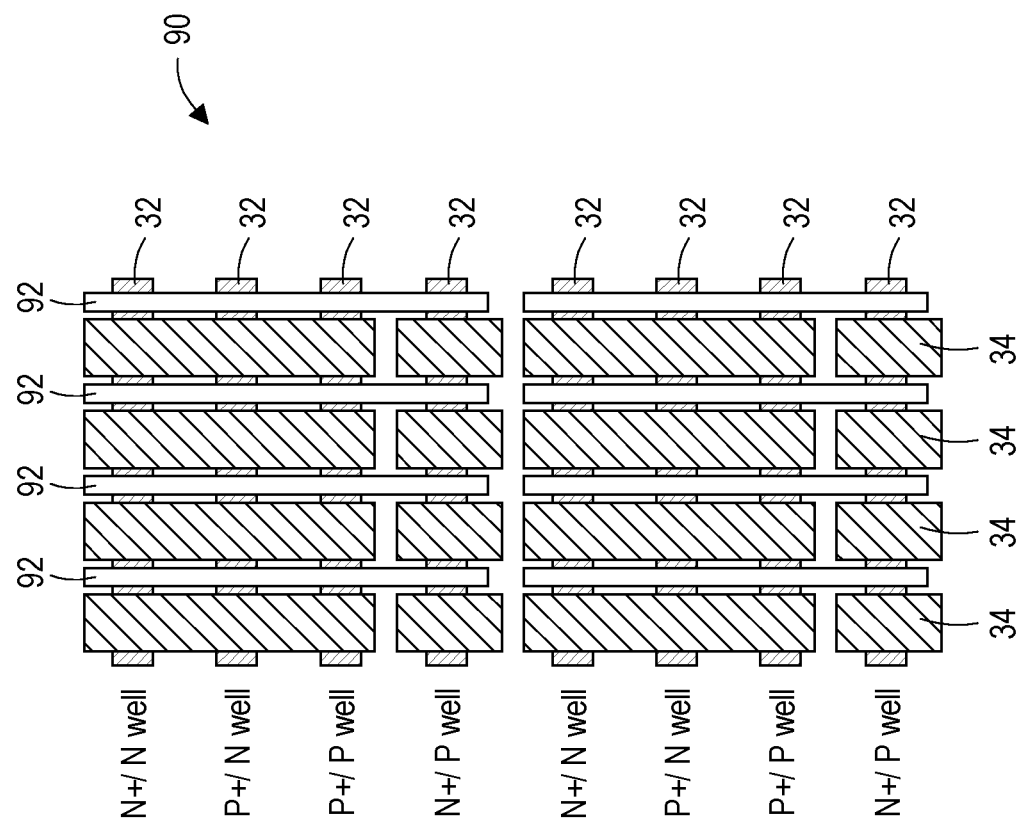
FIG. 11 diagrammatically illustrates an embodiment of VC-EBI test patterns including gate lines.

With reference to FIG. 11, to illustrate this an example is shown of test patterns 90 that again include the active structure 32 and the source/drain structures 34 separately in contact with the active structure 32, along with source/drain contacts (not shown) electrically connected to the source/drain structures 34; and which also include gate lines 92 oriented perpendicular to the active structures 32 and disposed between the source/drain structures 34. The gate lines 92 are suitably formed at the same time and using the same fabrication steps as the gate lines of the MOS devices of the IC dies 12.

Figure 12:
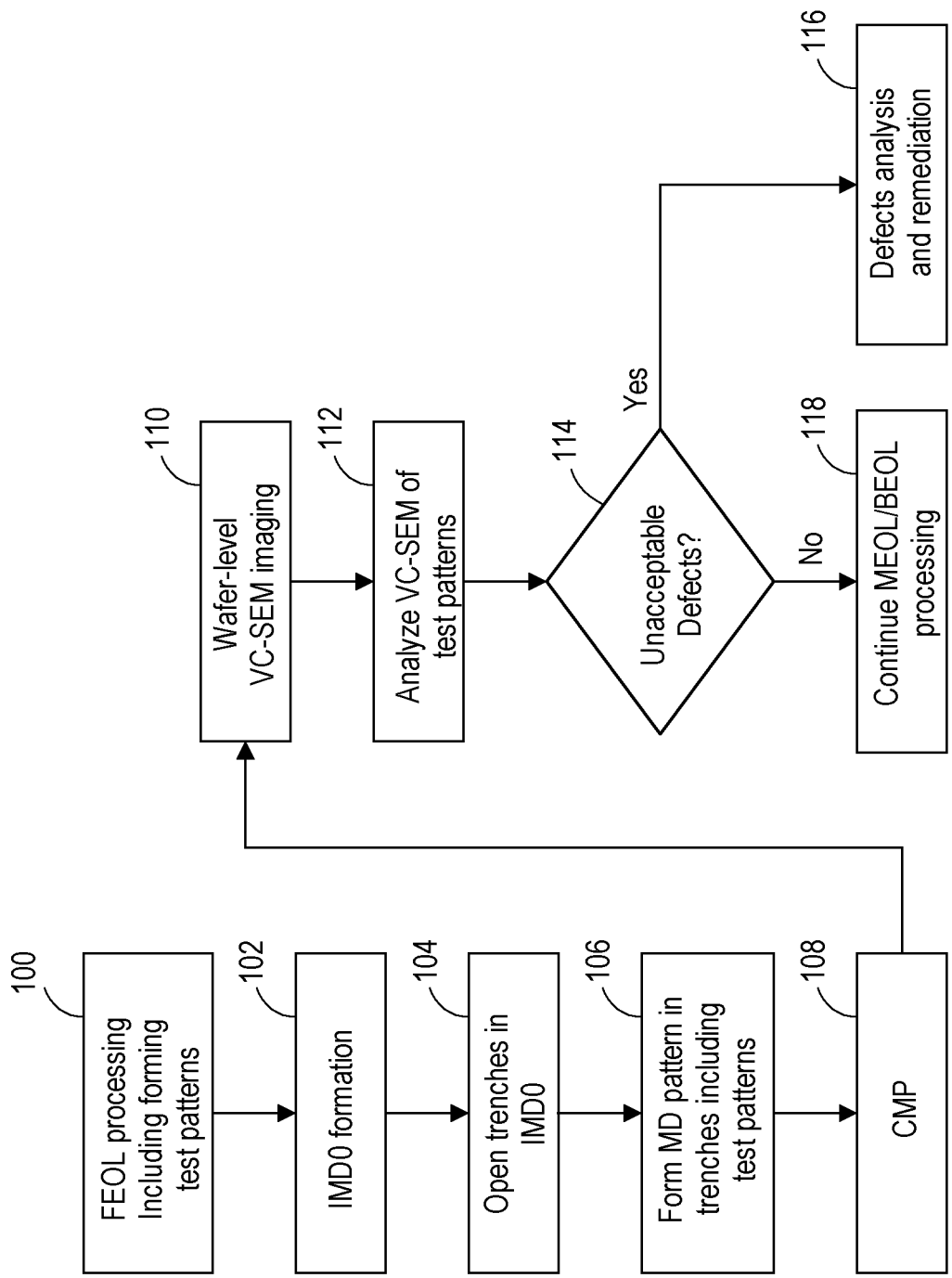
FIG. 12 illustrates by way of a flowchart a portion of a semiconductor manufacturing process including performing wafer inspection by VC-EBI using VC-EBI test patterns as described herein.

With reference to FIG. 12, a method is illustrated by way of a flowchart of a portion of a semiconductor manufacturing process including performing wafer assessment by VC-EBI using VC-EBI test patterns as described herein. In a step 100, front end-of-line (FEOL) processing is performed to fabricate IC dies 12 and the test patterns (e.g., various combinations of one or more of test patterns 40, 50, 60, and/or 80). Next, the MD contacts are formed. To this end, in a step 102, a first (or zeroth) intermetal dielectric (IMD0) is formed. In a step 104, trenches are opened in IMD0, and these are filled in a step 106 with tungsten or another MD metal to form the source/drain contacts electrically connected to the source/drain structures. In a step 108, chemical mechanical polishing (CMP) is performed to remove excess MD metal from the surface of IMD0. At this point, the FEOL processing and middle end-of-line (MEOL) processing have been performed up to the MD contact formation, and the wafer is ready for VC-EBI inspection.

To this end, at a step 110 wafer-level voltage contrast scanning electron microscopy (VC-SEM) imaging is performed. As previously discussed, this entails operating the SEM with a suitable stage bias and accelerating voltage of the electrons applied by the SEM to provide the desired landing energy for selected positive-mode or negative-mode VC-EBI. If both positive-mode and negative-mode VC-EBI are to be performed, the step 110 is performed for a landing energy effective to produce positive mode voltage contrast (e.g., landing energy LE$_1$ diagrammatically shown in FIG. 2), and also is performed for a landing energy effective to produce negative mode voltage contrast (e.g., landing energy LE$_2$ diagrammatically shown in FIG. 2). In an operation 112, the VC-SEM image (or images, in the case of both positive-mode and negative-mode images) are analyzed to identify shorting between adjacent source/drain structures of the test patterns according to a distribution of bright and dark image regions obtained by detecting secondary electrons emitted from the test patterns in response to the incident electron beam. In the case of the test patterns 60 of FIG. 6, for example, the distribution of bright and dark image regions indicative of shorting between adjacent N-type source/drain structures would constitute bright regions corresponding to the source/drain structures of the N+/P well structures of the combination 42 shown in FIG. 6, as illustrated in the positive-mode VC-EBI image 46 of FIG. 6. FIGS. 7-10 provide other nonlimiting illustrative examples of distributions of bright and dark image regions indicative of various types of shorting defects as previously described.

The results of the VC-EBI performed in steps 110 and 112 can be variously used. For example, in an illustrative decision step 116, it is determined whether the detected shorting defects are acceptable or unacceptable. If at the step 116 it is determined that the detected defects are unacceptable (for example, exceeding some permissible threshold average number of defects per area 30), then flow passes to step 118 where further analysis of the defects is performed (for example, using other inspection modalities, and/or by reviewing the fabrication process workflow to identify a root cause of the shorting defects, or so forth. On the other hand, if at the step 116 it is determined that the detected defects are acceptable then flow passes to step 118 for continuation of the MEOL and/or BEOL processing to complete fabrication of the IC dies, followed by operations such as dicing to separate along the scribe lines (which may cut through the VC-EBI test patterns which have by that point served their purpose) and packaging the separated IC dies.

Figure 13:
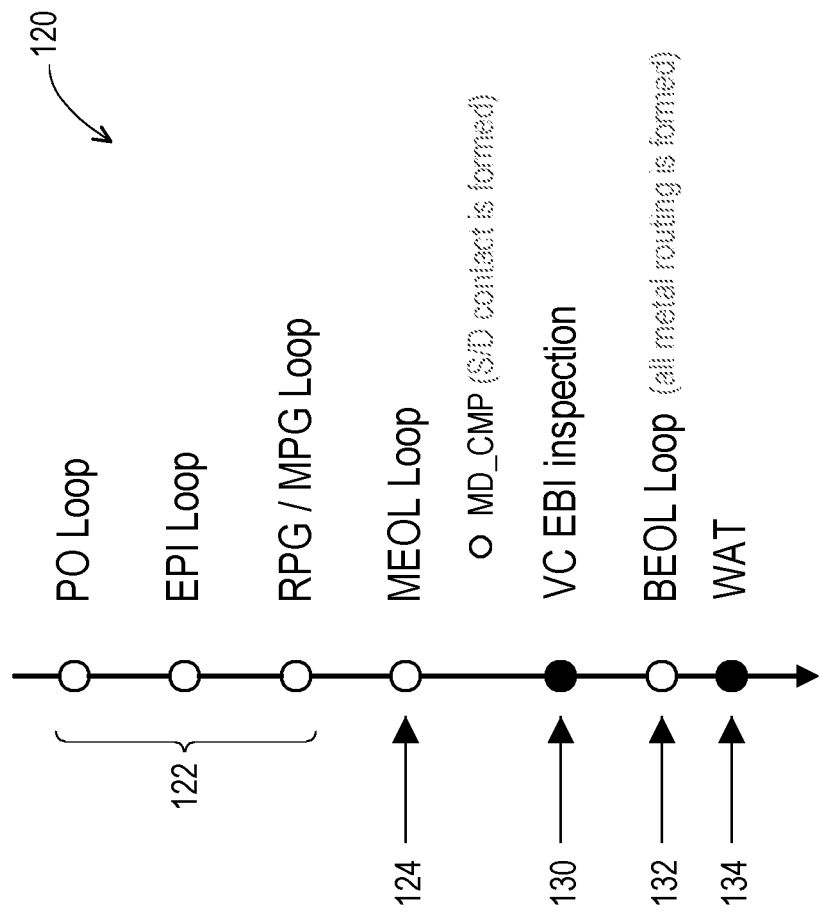
FIG. 13 illustrates a typical semiconductor manufacturing method including use of the VC-EBI testing as disclosed herein.

With reference to FIG. 13, an illustrative semiconductor manufacturing method 120 is shown, which incorporates the disclosed VC-EBI inspection. The illustrative semiconductor manufacturing method 120 includes front end-of-line (FEOL) processing 122 and optional MEOL processing 124. The FEOL processing 122 and optional MEOL processing 124 is effective to fabricate integrated circuit (IC) components including MOS devices, e.g. NMOS and/or PMOS devices. The operations of the FEOL processing 122 and optional MEOL processing 124 that produce the NMOS and/or PMOS IC components also produce a plurality of patterns on the semiconductor substrate, such as one or more of the test patterns 40, 50, 60, 80, and/or 90 of respective FIGS. 6, 7, 8 and 9, 10, and 11. Each pattern includes at least one active structure 32, source/drain structures 34 separately in contact with the active structure 32, and source/drain contacts electrically connected to the source/drain structures 34, as previously described with reference to FIG. 1.

With continuing reference to FIG. 13, after the FEOL processing 122 and optional MEOL processing 124 are complete, a VC-EBI inspection 130 is performed on the substrate including the plurality of patterns. This entails receiving a plurality of images by applying an electron beam to the patterns. Thereafter, the semiconductor substrate is transferred to a next process step, such as an illustrative back end-of-line (BEOL) process step 132, if there is no image conversion according to a predetermined image contrast property of the patterns. Illustrative examples of such an image conversion according to a predetermined image contrast property of the patterns have been previously described herein with reference to FIGS. 6-10. After completion of the fabrication steps 122, 124, 132 (and the inserted VC-EBI inspection 130), a wafer acceptance test (WAT) 134 which if also passed (along with optionally other tests) results in the wafer being shipped to a customer, deployed in-house, or otherwise utilized.

On the other hand, if at the VC-EBI inspection 130 an image conversion according to a predetermined image contrast property of the patterns is observed, then as previously described with reference to FIGS. 6-10 this suggests the NMOS and/or PMOS components of the IC may have undesirable shorting, and so in this case the semiconductor may undergo further testing and/or be discarded.

In the following, some further embodiments are described.

In a nonlimiting illustrative embodiment, a semiconductor manufacturing method includes providing a plurality of patterns on a semiconductor substrate. The patterns include an NMOS structure comprising at least one active structure formed with P type doping in contact with at least one source/drain structure of N type doping arranged next to an N+/N well structure comprising at least one active structure formed with N-type doping in contact at least one source/drain structure of N type doping. The method further includes: receiving a plurality of images by applying an electron beam to the patterns; and transferring the semiconductor substrate to a next process step if there is no image conversion according to a predetermined image contrast property of the patterns.

In a nonlimiting illustrative embodiment, a device comprises a wafer and patterns disposed on a surface of the wafer. The patterns include at least one of: (i) an NMOS structure comprising at least one active structure formed with P type doping in contact with at least one source/drain structure of N type doping arranged next to an N$^+$/N well structure comprising at least one active structure formed with N-type doping in contact at least one source/drain structure of N type doping; and/or (ii) a PMOS structure comprising at least one active structure formed with N type doping in contact with at least one source/drain structure of P type doping arranged next to a P$^+$/P well structure comprising at least one active structure formed with P-type doping in contact at least one source/drain structure of P type doping.

In a nonlimiting illustrative embodiment, a semiconductor manufacturing method includes providing a plurality of patterns on a semiconductor substrate. The patterns include a PMOS structure comprising at least one active structure formed with N type doping in contact with at least one source/drain structure of P type doping arranged next to a P$^+$/P well structure comprising at least one active structure formed with P-type doping in contact at least one source/drain structure of N type doping. The method further includes: receiving a plurality of images by applying an electron beam to the patterns; and transferring the semiconductor substrate to a next process step if there is no image conversion according to a predetermined image contrast property of the patterns.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor manufacturing method, comprising:
providing a plurality of patterns on a semiconductor substrate, wherein the patterns include an NMOS structure comprising at least one active structure formed with P-type doping in contact with at least one first source/drain structure of N-type doping arranged next to an N$^+$/N well structure comprising at least one active structure formed with N-type doping in contact with at least one second source/drain structure of N-type doping;
receiving a plurality of images including at least one positive mode voltage contrast electron beam inspection (VC-EBI) image obtained by applying an electron beam to the patterns with a landing energy effective to produce positive mode voltage contrast; and
transferring the semiconductor substrate to a next process step if the at least one first source/drain structure has dark voltage contrast in the at least one positive mode VC-EBI image.

2. The semiconductor manufacturing method of claim 1 wherein the active structures of the patterns comprise one or more mutually parallel fins disposed on the surface of the wafer.

3. The semiconductor manufacturing method of claim 1 wherein the patterns further include a PMOS structure comprising at least one active structure formed with N-type doping in contact with at least one source/drain structure of P-type doping arranged next to a P$^+$/P well structure comprising at least one active structure formed with P-type doping in contact with at least one source/drain structure of P-type doping.

4. The semiconductor manufacturing method of claim 3 wherein the providing of the electron beam further includes providing the electron beam with a landing energy effective to produce negative mode voltage contrast and the plurality of images includes at least one negative mode voltage contrast electron beam inspection (VC-EBI) image.

5. The semiconductor manufacturing method of claim 1 wherein the patterns further include a PMOS structure comprising at least one active structure formed with N-type doping in contact with at least one source/drain structure of P-type doping arranged next to an NMOS structure comprising at least one active structure formed with P-type doping in contact with at least one source/drain structure of N-type doping.

6. The semiconductor manufacturing method of claim 1 wherein the patterns further include an NMOS structure comprising at least one active structure formed with P-type doping in contact with at least one source/drain structure of N-type doping arranged next to a second NMOS structure comprising at least one active structure formed with P-type doping in contact with at least one source/drain structure of N-type doping.

7. The semiconductor manufacturing method of claim 1 wherein the patterns further include a PMOS structure comprising at least one active structure formed with N-type doping in contact with at least one source/drain structure of P-type doping arranged next to a second PMOS structure comprising at least one active structure formed with N-type doping in contact with at least one source/drain structure of P-type doping.

8. The semiconductor manufacturing method of claim 1 wherein the providing of the plurality of patterns on the semiconductor substrate comprises performing front end-of-line (FEOL) processing of an integrated circuit (IC) manufacturing process, and the next process step comprises a back end-of-line (BEOL) processing step.

9. The semiconductor manufacturing method of claim 1 wherein the patterns are disposed on a surface of a substrate and the active structures of the patterns comprise mutually parallel linear fins each extending away from the surface of the substrate, and the patterns further include gate lines crossing and oriented perpendicular to the linear fins.

10. The semiconductor manufacturing method of claim 1 wherein the patterns are disposed on a wafer that also has an array of integrated circuit (IC) dies disposed thereon, and the patterns are disposed between the IC dies.

11. A semiconductor manufacturing method comprising:
providing patterns disposed on a surface of a wafer, wherein the patterns include at least one of:
an NMOS structure comprising at least one active structure formed with P-type doping in contact with at least one first source/drain structure of N-type doping and an N$^+$/N well structure comprising at least one active structure formed with N-type doping in contact with at least one second source/drain structure of N-type doping; and
a PMOS structure comprising at least one active structure formed with N-type doping in contact with at least one first source/drain structure of P-type doping and a P$^+$/P well structure comprising at least one active structure formed with P-type doping in contact with at least one second source/drain structure of P-type doping;
receiving a plurality of images including at least one positive mode voltage contrast electron beam inspection (VC-EBI) image obtained by applying an electron beam to the patterns with a landing energy effective to produce positive mode voltage contrast and at least one negative mode voltage contrast electron beam inspection (VC-EBI) image obtained by applying an electron beam to the patterns with a landing energy effective to produce negative mode voltage contrast; and
transferring the semiconductor substrate to a next process step if the at least one first source/drain structure of the NMOS structure has dark voltage contrast in the at least one positive mode VC-EBI image and at least one first source/drain structure of the PMOS structure has bright voltage contrast in the at least one negative mode VC-EBI image.

12. The semiconductor manufacturing method of claim 11 wherein the patterns include said NMOS structure arranged next to said N$^+$/N well structure.

13. The semiconductor manufacturing method of claim 11 wherein the patterns include said PMOS structure arranged next to said P$^+$/P well structure.

14. The semiconductor manufacturing method of claim 11 wherein the patterns further include a PMOS structure comprising at least one active structure formed with N-type doping in contact with at least one source/drain structure of P-type doping arranged next to an NMOS structure comprising at least one active structure formed with P-type doping in contact with at least one source/drain structure of N-type doping.

15. The semiconductor manufacturing method of claim 11 wherein the active structures of the patterns comprise one or more mutually parallel fins disposed on the surface of the wafer.

16. The semiconductor manufacturing method of claim 15 wherein the patterns further include gate lines crossing and oriented perpendicular to the fins.

17. The semiconductor manufacturing method of claim 11 further comprising:
an array of integrated circuit (IC) dies disposed on the surface of the wafer, and the patterns are disposed on the surface of the wafer between the IC dies.

18. A semiconductor manufacturing method, comprising:
providing a plurality of patterns on a semiconductor substrate, wherein the patterns include a PMOS structure comprising at least one active structure formed with N-type doping in contact with at least one first source/drain structure of P-type doping arranged next to a $P^+/P$ well structure comprising at least one active structure formed with P-type doping in contact with at least one second source/drain structure of P-type doping;
receiving a plurality of images including at least one negative mode voltage contrast electron beam inspection (VC-EBI) image obtained by applying an electron beam to the patterns with a landing energy effective to produce negative mode voltage contrast; and
transferring the semiconductor substrate to a next process step if the at least one first source/drain structure has bright voltage contrast in the at least one negative mode VC-EBI image.

19. The semiconductor manufacturing method of claim 18 wherein the providing of the plurality of patterns on the semiconductor substrate comprises performing front end-of-line (FEOL) processing of an integrated circuit (IC) manufacturing process, and the next process step comprises a back end-of-line (BEOL) processing step.

20. The semiconductor manufacturing method of claim 18 wherein the patterns further include a PMOS structure comprising at least one active structure formed with N-type doping in contact with at least one source/drain structure of P-type doping arranged next to an NMOS structure comprising at least one active structure formed with P-type doping in contact with at least one source/drain structure of N-type doping.

* * * * *